United States Patent [19]

Yamada et al.

[11] Patent Number: 4,955,820
[45] Date of Patent: Sep. 11, 1990

[54] T-LEG SMT CONTACT

[75] Inventors: Shoji Yamada, Tokyo; Tomoo Yamada, Yokohama, both of Japan

[73] Assignee: Molex Incorporated, Lisle, Ill.

[21] Appl. No.: 447,350

[22] Filed: Dec. 7, 1989

[30] Foreign Application Priority Data

Dec. 9, 1988 [JP] Japan .................. 63-160024[U]

[51] Int. Cl.$^5$ .......................... H01R 4/02; H01R 9/09
[52] U.S. Cl. ...................................... 439/83; 439/876
[58] Field of Search .................................. 439/83, 876

[56] References Cited

U.S. PATENT DOCUMENTS

| 4,802,860 | 2/1989 | Kikuta | 439/83 X |
| 4,808,113 | 2/1989 | Kanesige et al. | 439/83 X |
| 4,826,442 | 5/1989 | Douty et al. | 439/83 X |

Primary Examiner—Eugene F. Desmond
Attorney, Agent, or Firm—Louis A. Hecht; Stephen Z. Weiss

[57] ABSTRACT

Disclosed is a surface-mounted component's contact having an inverted "T"-shaped soldering portion. The contact is to be mounted to the surface of a printed circuit board, and is to be electrically connected to a conductor on the printed circuit board by soldering its soldering portion to the conductor. The soldering portion comprises a flat foot and a leg, which is integrally connected to and rising from the midportion of said foot. The relatively large foot has an effect of causing substantial reduction of the load per unit of solder upon application of an undesired force to the terminal, and of increasing the resistivity of the solder against removal from the conductor of the printed circuit board.

6 Claims, 4 Drawing Sheets

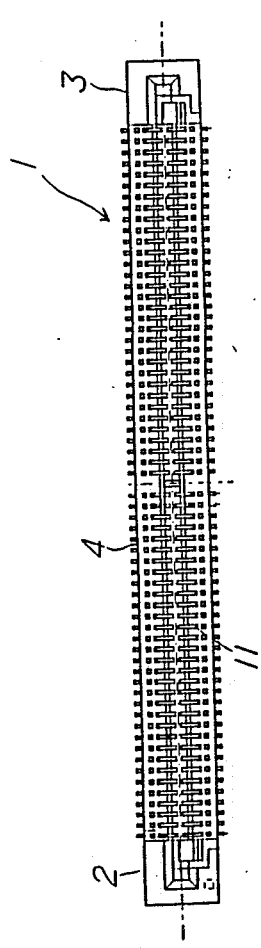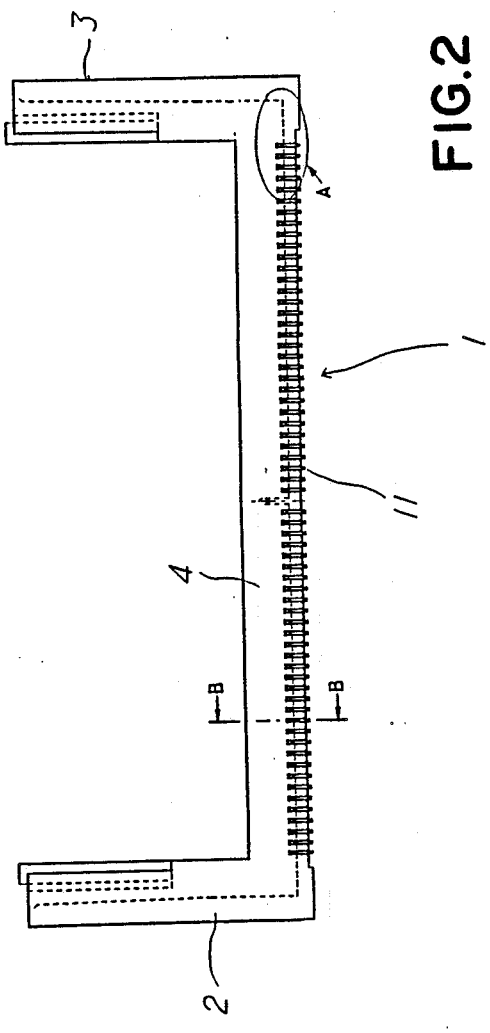

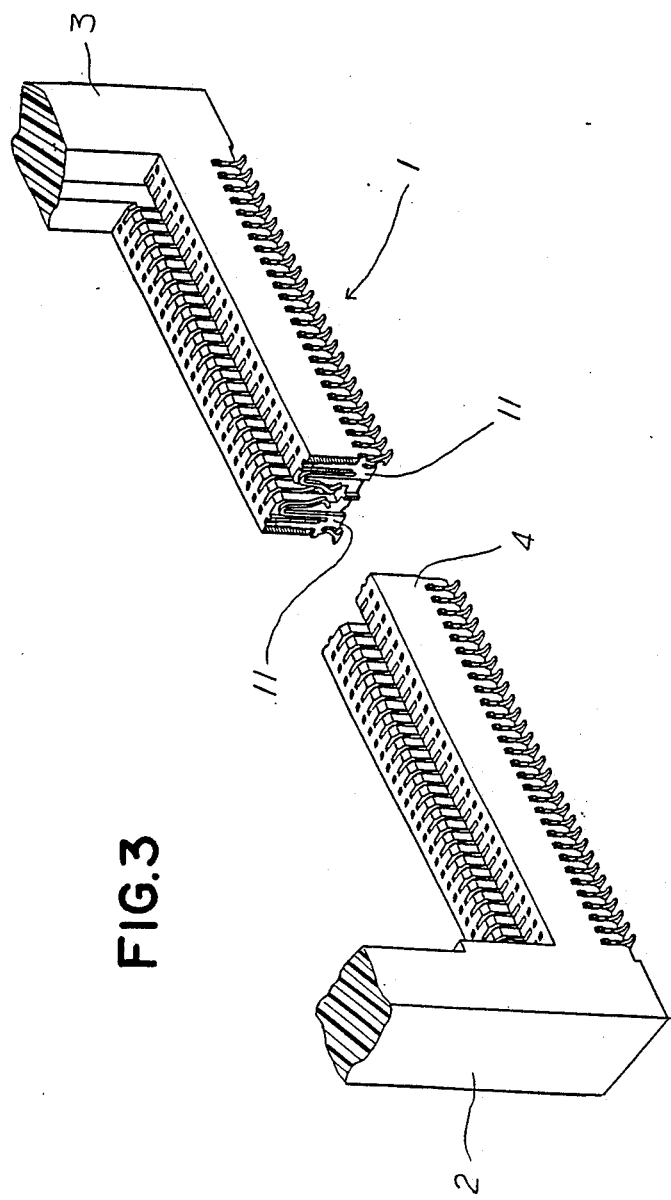

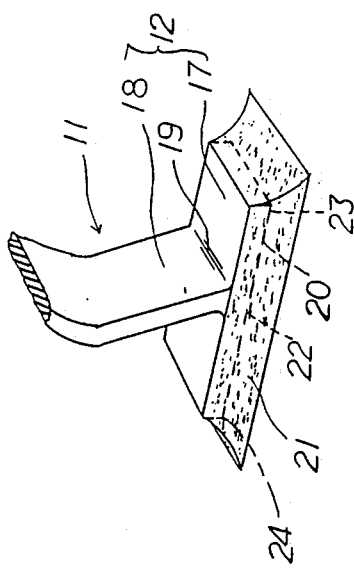
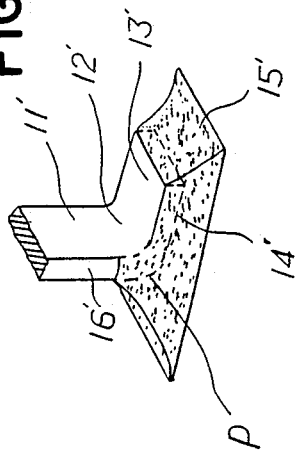
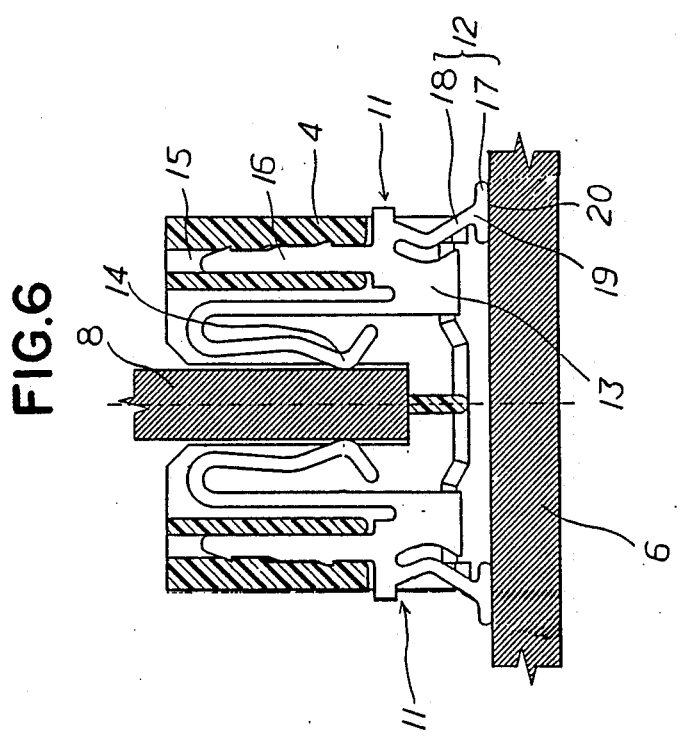
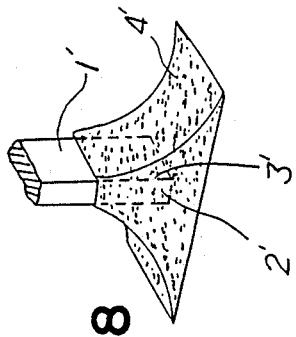

T-LEG SMT CONTACT

BACKGROUND OF THE INVENTION

1. Field of the Invention

The present invention relates to an electrical contact of an electric component to be mounted to a printed circuit board, such as electrical connector, carrier chip switch, capacitor, electrical connection member or any other electrical part, and more particularly to an improved shape of the soldering portion of an electrical contact of such surface-mounted component.

2. Description of the Prior Art

As is well known, a variety of electric components are mounted to a printed circuit board by soldering the lead wire terminals of such electrical components to the surface of the printed circuit or by connecting them to the surface of the printed circuit with the aid of lead-less means. In the former the strength with which the lead wire terminals are fixed to the surface of the printed circuit, and the quality with which the lead wire terminals are electrically connected to the surface of the printed circuit depends on the shape of the lead wire terminal, and on the soldering condition resulting from the particular shape of the lead wire terminal. Therefore, the lead wire terminal shape and the soldering strength attained thereby have been studied, and these factors are taken into consideration in designing lead wire terminals.

A conventional lead wire terminal is shown in FIG. 8. As shown, the soldering portion 2' of the terminal 1' is of rod shape. The end surface 3' of the rod-shaped soldering portion 2' is put on a conductor, and then its surface is joined to the surface of the conductor as indicated at 4'. As shown, the soldering skirts the lead wire terminal.

Advantageously, the rod-shape of this lead wire terminal soldering portion 2' makes it easy to produce a lot of such metal pieces by stamping metal sheets. When an exterior force is applied to the terminal 1', the soldering skirt 4' will be loaded from the soldering portion 2'. Disadvantageously, the load per unit soldering area will be great because of the relatively small contact area between the rod-shaped soldering portion 2' and the surrounding soldering skirt 4', and therefore, the soldering portion 2' is liable to be removed from the conductor.

FIG. 9 shows another conventional lead wire terminal 11' having an "L"-shaped soldering portion 12'. It is composed of a horizontal foot 13'. As shown, the end surface 14' of the foot 13' of the "L"-shaped soldering portion 12' is put on the conductor, and then the surface of the soldering portion 12' is joined to the surface of the conductor as indicated at 15'.

When an undesired exterior force is applied to the lead wire terminal 11', the load per unit area on the soldering skirt 15' will be relatively small because the end surface area 14' is relatively large, accordingly increasing the resistance of the soldering portion against the exterior force to remove the lead wire terminal 11' from the underlaying conductor. In case that a strong pull is applied to the vertical leg 16' of the lead wire terminal 11', the pulling force is liable to concentrate to the bent portion "P" of the "L"-shaped soldering portion 12 . As a result a fatigue failure is liable to appear at this bent portion, allowing the soldering portion to be removed from the conductor. The jointing strength between the soldering and the conductor results only from the soldering around the bent portion of the "L"-shaped lead wire terminal. The remaining contact area of the "L"-shaped piece even though it is relatively large in area, has little effect of increasing the jointing strength.

With the above in mind, the object of the present invention is to provide a surface-mounted component's contact having an improved soldering portion which is capable of preventing localized concentration of force in the soldering portion as is the case with a conventional "L"-shaped contact when pulled up, and is capable of minimizing the load per unit soldering area upon application of undesired external force to the contact, thereby preventing the fatigue failure or removal of the contact from the conductor, and assuring that sufficient joining strength to the conductor is maintained at all times and that good electrical contact is kept at all times.

To attain this object a surface-mounted component's contact having a soldering portion, which contact is to be mounted to the surface of a printed circuit board and is to be electrically connected to a conductor on said printed circuit board by soldering its soldering portion to said conductor, is improved according to the present invention in that said soldering portion comprises a fat foot and a leg, which is integrally connected to and rising from the midportion of said foot, thus generally shaped in the form of an inverted "T", said soldering portion being a metal piece made by stamping a metal blank.

The soldering portion of the contact has an extensive foot, and the soldering material will be applied over this extensive foot. When an undesired external force is applied to the contact, and hence the soldering skirt, the force will be distributed evenly over the extensive area of the contact foot, thus reducing the load per unit soldering area to possible minimum.

In case that a strong pull is applied to the contact to raise it apart from the conductor, the force will be transmitted to the horizontal foot via the joint between the horizontal foot and the vertical leg of the contact, and will be evenly distributed in the surrounding soldering skirt in all directions thanks to the location of the joint in the midpoint of the foot. Thus, no fatigue failure will be caused in the soldering skirt, and the peeling-off of soldering material will be prevented. The inverted "T"-shape of the contact piece has the effect of holding the joint strength and electrical contact in good, reliable condition.

The inverted "T"-shape of the contact piece permits the stamping-out of the contact from metal sheets. This assures that a metal piece has a strong joint between horizontal and vertical portions.

Other objects and advantages of the present invention will be understood from the following description of a contact structure according to the preferred embodiment of the present invention, which is shown in accompanying drawings:

FIG. 1 is a plane view of an electrical contact assembly having an array of terminal structures according to the present invention;

FIG. 2 is a front view of the electrical contact assembly;

FIG. 3 is a perspective view of the electrical contact assembly with its midlength eliminated;

FIG. 6 is a sectional view, showing the contact piece pair with its feet soldered to a conductor on a printed circuit board, said contact piece pair receiving and resiliently holding and contacting another printed circuit board between its contact arms;

FIG. 7 is a perspective view to the portion at which the contact is soldered to a conductor;

FIG. 8 is a similar perspective view, but showing the soldering of a contact piece; and FIG. 9 is a similar perspective view, showing the soldering of another conventional contact piece.

DESCRIPTION OF PREFERRED EMBODIMENTS

Figure 4:
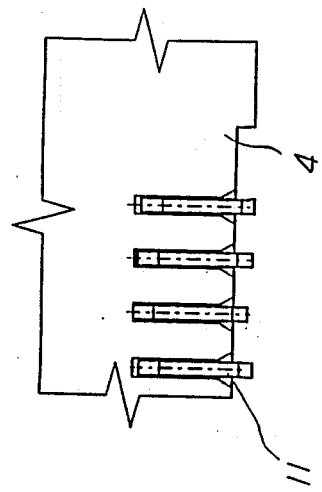
FIG. 4 is an enlarged view of the portion of the contact assembly and indicated by line A in FIG. 2.

The present invention is described as being applied to an electrical connector. FIGS. 1-5 shows an electrical contact assembly having an array of terminal structures according to the present invention.

As shown in these drawings, the electrical connector 1 comprises an elongated body 4 having extensions 2 and 3 integrally connected to the opposite ends of the elongated body 4. A plurality of terminals 11 according to the present invention are fixed to the elongated body 4 at regular intervals. As best seen from FIG. 5, each terminal 11 is integrally jointed to a counter terminal 11, and is fixed to the elongated body 4 to face the counter terminal 11.

Figure 5:
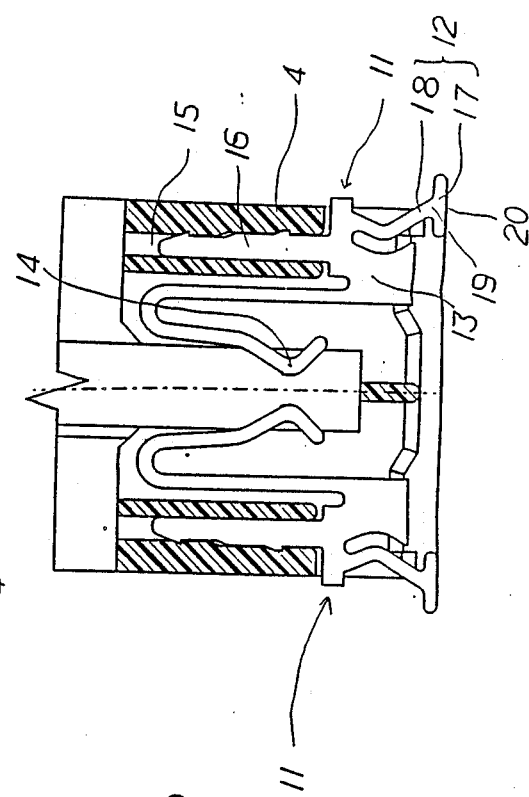
FIG. 5 is an enlarged sectional view of the portion of the contact assembly taken along the line 5—5 and seen from the direction as indicated by arrows.

Particularly, referring to FIGS. 5, 6 and 7, each terminal 11 comprises an inverted "T"-shaped soldering connecting portion 12, a trunk 13 integrally connected to the soldering connecting portion 12 and having an extended arm 16 to be inserted in a selected slot 15 of the elongated body 4, and a contact piece 14 integrally connected to the trunk 13. The terminal is a metal piece which is stamped out from a metal sheet.

The inverted "T"-shaped soldering connecting portion 12 comprises a relatively large foot 17 and a leg 18 integrally connected to the foot 17 as indicated at 19 and rising from the foot 17.

When in use, the foot 17 of each terminal 11 is soldered to a conductor on a printed circuit board 6 to join the surface of the foot 17 to the surface of the conductor, as indicated at 21. The soldering metal is metal and is allowed to invade somewhat the gap remaining between the end surface 20 of the foot 17 and the conductor surface.

When another circuit board 8 is inserted between the opposite extensions 2 and 3 of the elongated body 4, the contact 14 of each terminal 11 will be resiliently put in contact with a selected conductor on the printed circuit board 8. Likewise, the contact 14 of the counter terminal 11 will be sandwiched between these contacts 14.

As already described, the foot 17 has a relatively large area. Assume that an undesired exterior force is applied to the contact 14 of the terminal 11 and that the force is transmitted to the soldering skirt 21 via the leg 18, thereby loading the soldering skirt 21. The load per soldering unit area of the foot will not be great because of the increased soldering area which surrounds the relatively large foot 17.

When a printed circuit board 8 is inserted and then pulled up from the electrical connector 1, a raising force will be applied to the leg 18 of each terminal 11, and this force will be transmitted to the joint 19 between the leg 18 and the foot 17. The force will be distributed all the way from the mid-joint to each end 23 or 24 to evenly stress the whole soldering skirt 21. This is because the leg 18 rises from the center 22 of the foot 17. The force cannot be localized to the portion of the soldering skirt 21 around the joint 19. The even distribution of an undesired force prevents fatigue failure of soldering at a localized point, and assures good mechanical and electrical connection.

As described earlier, the terminal 11 is a metal piece stamped out from a metal sheet, and therefore the foot-and-leg joint has an increased strength, compared with the one in which a separate leg is integrally connected to a separate foot.

This particular embodiment is described as being applied to an electrical connector terminal, but it should be understood that the present invention can be equally applied to lead wire terminals for carrier chips, switchs, capacitors, resistors and any other components to be mounted to a printed circuit board.

As may he understood from the above the inverted "T"-shaped soldering portion of a terminal according to the present invention has a leg and a relatively large foot integrally connected to the center of the leg, thereby causing substantial reduction of load per unit soldering area upon application of an undesired force to the terminal, and increasing the resistivity of the soldering against removal from the conductor on a printed circuit board.

The leg is integrally connected to the center of the foot, and therefore, an undesired external force when applied to the terminal, will be transmitted to the foot and the surrounding soldering skirt so that the foot and the surrounding soldering skirt are evenly stressed, not localizing the force to particular points. Thus, the soldering strength will not be lowered, and the electrical connection will be kept in good condition.

The terminal is a metal piece which is stamped out from a metal sheet. Therefore, the joint between the foot and the leg has an increased strength. This contributes to the solidity of the soldering portion of the terminal which is fixed to the conductor on a printed circuit board.

What is claimed is:

1. Surface-mounted component's contact having a soldering portion, which contact is to be mounted to the surface of a printed circuit board 6 and is to be electrically connected to a conductor, characterized in that said soldering portion 12 comprises a flat foot 17 and a leg 18, which is integrally connected to and rising from the midportion of said foot 17, generally shaped in the form of an inverted "T", said soldering portion 12 being a metal piece made by stamping a metal blank.

2. Surface-mounted component's contact according to claim 1 wherein said flat foot 17 of said soldering portion 12 is rectangular, and said leg 18 is integrally connected to the midportion of said rectangular foot to rise upright therefrom, said leg 18 having a width equal to the short side of said rectangular foot.

3. Surface-mounted component's contact according to claim 1 wherein said leg 18 is integrally connected to a trunk 13 which is integrally connected to a contact piece 14, thereby constituting together a terminal 11 of an electric connector.

4. Surface-mounted component's contact according to claim 3 wherein said trunk 13 has an arm 16 extending parallel to said contact piece 14 and integrally connected to said trunk 13, said extending arm 16 being adapted to be inserted in a selected slot 15 of an elongated body 4.

5. Surface-mounted component's contact according to claim 4 wherein said soldering portion 12 comprising said flat, rectangular foot 17 and said leg 18, said trunk 13, said contact piece 14 and said extended arm 16 are integrally connected together in a unitary form stamped out from a metal sheet.

6. Surface-mounted component's contact according to claim 2 wherein a pair of terminals 11 each stamped out from a metal sheet are arranged with their contact pieces 14 facing each other at a predetermined interval, and their feet soldered to a conductor on said printed circuit board 6.

* * * * *